US010794533B1

(12) United States Patent
Correll et al.

(10) Patent No.: US 10,794,533 B1
(45) Date of Patent: Oct. 6, 2020

(54) VARIABLE-GEOMETRY MOUNTING BRACKET FOR A DIN RAIL

(71) Applicant: Phoenix Contact Development and Manufacturing, Inc., Middletown, PA (US)

(72) Inventors: Michael Anthony Correll, Hershey, PA (US); Scott Michael Frye, Palmyra, PA (US)

(73) Assignee: Phoenix Contact Development and Manufacturing, Inc., Middletown, PA (US)

( * ) Notice: Subject to any disclaimer, the term of this patent is extended or adjusted under 35 U.S.C. 154(b) by 0 days.

(21) Appl. No.: 16/406,689

(22) Filed: May 8, 2019

(51) Int. Cl.
 F16M 13/02 (2006.01)
 H05K 7/14 (2006.01)
(52) U.S. Cl.
 CPC ............. F16M 13/022 (2013.01); H05K 7/14 (2013.01)
(58) Field of Classification Search
 CPC ............................... F16M 13/022; H05K 7/14
 See application file for complete search history.

(56) References Cited

U.S. PATENT DOCUMENTS

| 3,734,439 | A | * | 5/1973 | Wintz | A47G 23/0241 |
| | | | | | 248/224.51 |
| 4,111,517 | A | | 9/1978 | Debaight | |
| 4,600,174 | A | | 7/1986 | Gosse et al. | |
| 4,697,774 | A | | 10/1987 | Sarton et al. | |
| 5,044,589 | A | * | 9/1991 | Milne | A47H 1/124 |
| | | | | | 160/902 |
| 5,090,922 | A | | 2/1992 | Rymer et al. | |
| 5,174,788 | A | | 12/1992 | Herbert | |
| 5,192,227 | A | * | 3/1993 | Bales | H01R 9/2608 |
| | | | | | 439/532 |
| 5,529,273 | A | * | 6/1996 | Benthin | A47H 1/142 |
| | | | | | 248/254 |
| 5,794,895 | A | * | 8/1998 | Besserer | H02B 1/202 |
| | | | | | 248/73 |
| 7,073,971 | B2 | | 7/2006 | Schurr et al. | |
| 8,787,023 | B2 | | 7/2014 | Lewis, II et al. | |
| 9,127,807 | B1 | | 9/2015 | Holloway et al. | |
| 9,363,918 | B2 | | 6/2016 | Santonie et al. | |
| 9,685,716 | B2 | | 6/2017 | Sasano | |
| 10,182,651 | B2 | | 1/2019 | Jost et al. | |

(Continued)

FOREIGN PATENT DOCUMENTS

DE 8402002 U1 5/1984
DE 3805867 A1 8/1989

(Continued)

OTHER PUBLICATIONS

European Patent Office, International Search Report in corresponding PCT/US2020/021963, dated Jun. 18, 2020, 14 pages.

(Continued)

Primary Examiner — Anita M King
(74) Attorney, Agent, or Firm — Hooker & Habib, P.C.

(57) ABSTRACT

A mounting bracket for attaching a component housing to a mounting rail includes a mounting clip and a base. The mounting clip carries the component housing and the base attaches the mounting clip to the mounting rail. The mounting clip is rotatably attached to the base to enable positioning the component housing in different angular positions with respect to the mounting rail.

14 Claims, 8 Drawing Sheets

(56) References Cited

U.S. PATENT DOCUMENTS

2010/0255713 A1* 10/2010 Peng .................. H02B 1/052
439/532
2018/0166804 A1 6/2018 Lessard Fontaine et al.

FOREIGN PATENT DOCUMENTS

| EP | 2190087 A2 | 5/2010 |
| GB | 2522058 A | 7/2015 |
| WO | 9630968 A1 | 10/1996 |
| WO | 2017072549 A1 | 5/2017 |

OTHER PUBLICATIONS

European Patent Office, English-language machine translation of specification of DE3805867, 4 pages.
European Patent Office, English-language machine translation of specification of DE8402002U1, 7 pages.

\* cited by examiner

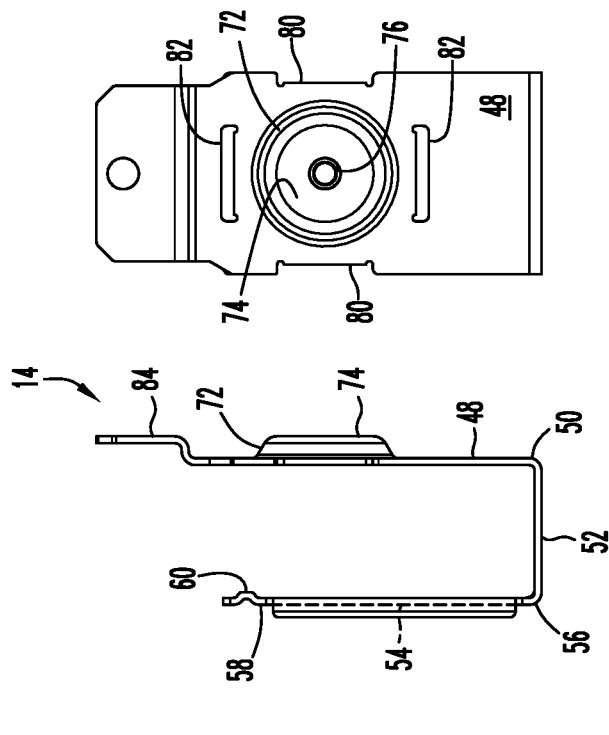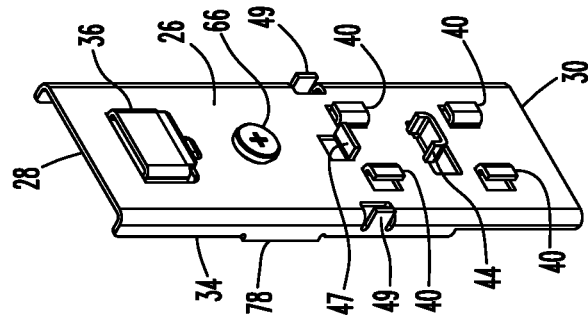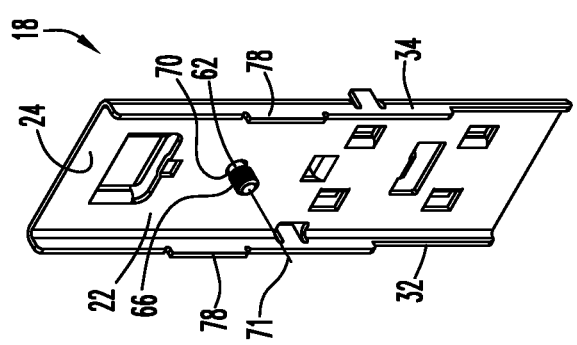

VARIABLE-GEOMETRY MOUNTING BRACKET FOR A DIN RAIL

FIELD OF THE DISCLOSURE

The disclosure relates generally to a mounting bracket for attaching an electronics component housing to a mounting rail.

BACKGROUND OF THE DISCLOSURE

Component housings for electronics components such as process control equipment are often mounted on metal mounting rails located inside equipment cabinets and the like.

DIN rails are a standardized mounting rail widely used in the process control industry. DIN rails are supplied in a number of standardized shapes. A top hat DIN rail has outwardly extending flanges running the length of the rail that are co-planar with one another. A C section DIN rail has inwardly extending flanges running the length of the rail that are co-planar with one another. A G section DIN rail has inwardly extending flanges running the length of the rail that are parallel but not co-planar.

Component housings for mounting on a DIN rail typically include a DIN rail retention latch located on the bottom of the housing that mounts on the housing to the DIN rail. When attached to the DIN rail the component housing extends in a height direction away from the DIN rail in a direction perpendicular to the planes defined by the DIN rail flanges.

SUMMARY OF THE DISCLOSURE

Disclosed is a mounting bracket that can be attached to a mounting rail such as a standard DIN rail for mounting a component housing to the rail. The disclosed mounting bracket when configured to be attached to a DIN rail orients the height dimension of the housing to be in a plane parallel with the planes defined by the DIN rail flanges. This enables the user more versatility in positioning the electrical component within the equipment cabinet as compared to only directly attaching the electrical component to the DIN rail.

The disclosed mounting bracket further enables the angular orientation of the component housing to be selectively positioned in different positions with respect to an axis of rotation perpendicular to the planes of the DIN rail flanges for additional versatility in positioning the electrical component within the cabinet regardless of whether the rail is mounted horizontally or vertically within the cabinet.

A mounting bracket in accordance with this disclosure includes a mounting clip and a base. The mounting clip includes an attachment portion that attaches the component housing to the mounting clip. The base includes a first side, an opposite second side, and a latch on the second side. The latch is capable of attaching the base to the mounting rail.

The mounting clip is rotatably attached to the base and is both rotatable about an axis and axially movable with respect to the base parallel with the axis towards and away from the base. The mounting clip is axially movable between a disengaged position spaced from the base and an engaged position adjacent to the base.

The mounting clip when in the disengaged position is able to rotate about the axis to selectively orient the mounting clip in a selected angular position with respect to the base. The mounting clip when in the disengaged position is also axially movable to the engaged position while maintaining the mounting clip in the selected angular position. When the mounting clip is in the engaged position while in the selected angular position, the mounting clip and the base cooperatively resist substantial rotation of the mounting clip away from the selected angular position.

In possible embodiments of the mounting bracket the mounting clip and the base are attached by a nut and bolt. The bolt can be rotated to move the mounting clip between disengaged and engaged positions.

In yet other possible embodiments of the mounting bracket the mounting clip and the base cooperatively form a nonrotatable connection between them when the mounting clip is in the engaged position while the mounting clip is in a selected angular position. The nonrotatable connection resists rotation of the mounting clip away from the selected angular position (not including any slight free play caused by tolerances or the like).

In yet other possible embodiments of the mounting bracket the mounting clip is designed to mount the component housing to a flat panel without use of the base.

Other objects and features of the disclosure will become apparent as the description proceeds, especially when taken in conjunction with the accompanying drawing sheets illustrating one or more illustrative embodiments.

BRIEF DESCRIPTION OF THE DRAWINGS

FIG. 7 is a perspective view of the front of the base plate of the base shown in FIG. 1.

FIG. 8 is a perspective rear view of the base plate shown in FIG. 7.

FIG. 9 is a side view of the mounting clip shown in FIG. 1.

FIG. 10 is a rear view of the mounting clip shown in FIG. 9.

DETAILED DESCRIPTION

FIGS. 1-4 illustrate an embodiment of a variable geometry mounting bracket 10 in accordance with the disclosure. The mounting bracket 10 includes a base 12, a mounting clip 14, and a fastener assembly 16 that removably attaches the mounting clip to the base.

Figure 1:
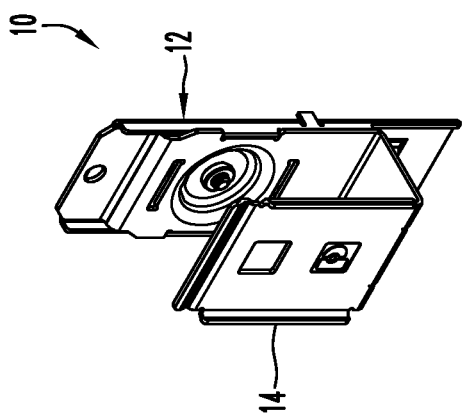
FIG. 1 is a perspective view of a first embodiment mounting bracket in accordance with the disclosure, the mounting clip in the zero degrees position with respect to the base.
Figure 2:
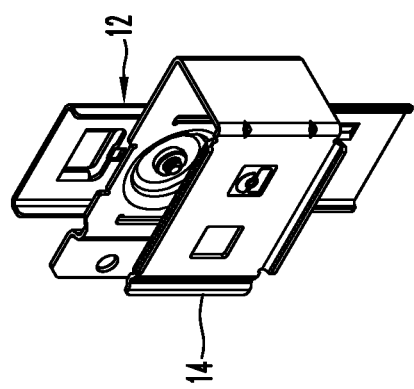
FIG. 2 is similar to FIG. 1 but with the mounting clip in the ninety degrees position.
Figure 3:
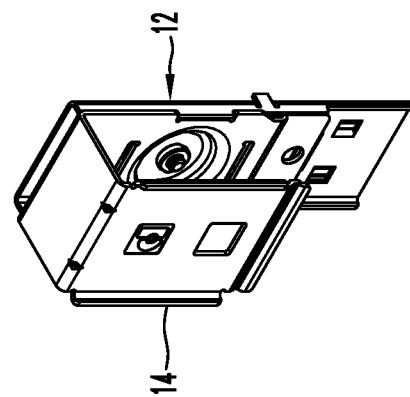
FIG. 3 is similar to FIG. 1 but with the mounting clip in the one hundred eighty degrees position.
Figure 4:
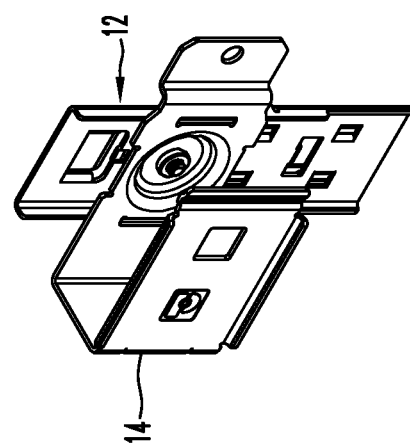
FIG. 4 is similar to FIG. 1 but with the mounting clip in the two hundred seventy degrees position.

As described in more detail below, the illustrated mounting bracket 10 enables the mounting clip 14 to be rotated with respect to the base 12 to any one of four different angular positions spaced ninety degrees apart from each other. FIG. 1 illustrates the mounting clip at the zero degrees position with respect to the base. FIG. 2 illustrated the mounting clip at the ninety degrees position with respect to the base. FIG. 3 illustrates the mounting clip at the one hundred eighty degrees position with respect to the base. FIG. 4 illustrates the mounting clip at the two hundred seventy degrees position with respect to the base.

Figure 6:
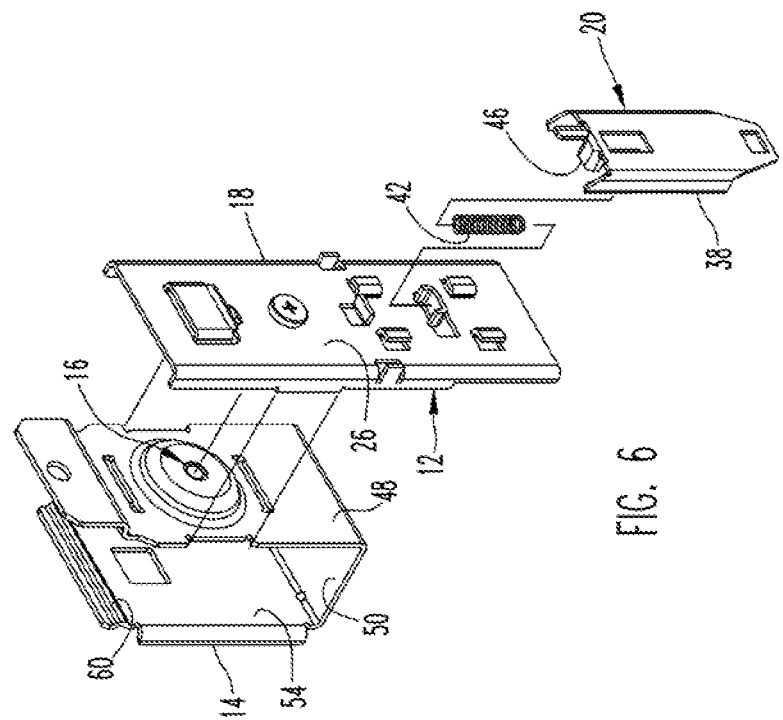
FIG. 6 is an exploded rear-right perspective view of the mounting bracket shown in FIG. 1.
Figure 5:
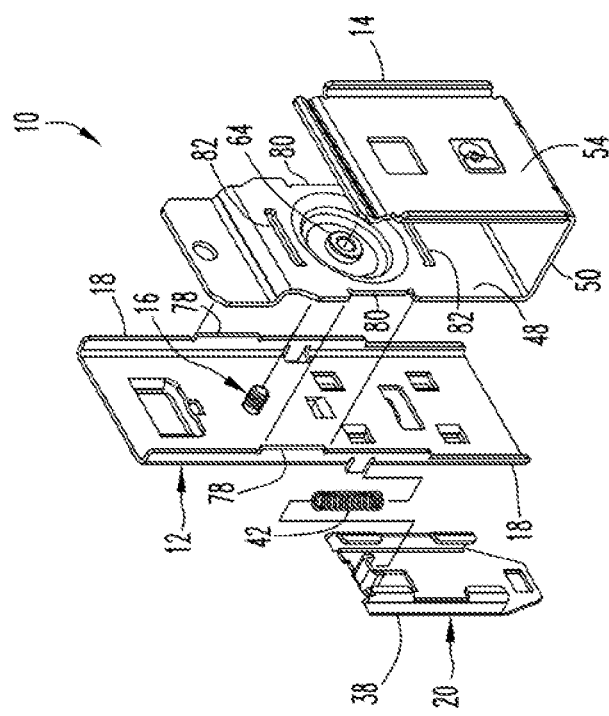
FIG. 5 is an exploded front-left perspective view of the mounting bracket shown in FIG. 1.

FIGS. 5 and 6 are exploded views of the mounting bracket 10. The mounting bracket 10 mounts a component housing (not shown) to a DIN rail (not shown). The base 12 mounts the mounting bracket to the DIN rail. The base includes a generally U-shaped base plate 18 and a DIN rail retention latch 20 attached to the base plate. The latch attaches the base plate to the DIN rail.

The base plate 18 is shown in FIGS. 7 and 8. The base plate has a plate portion 22 having a generally flat first side or surface 24 and an opposite flat second side 26. The base plate extends laterally between a first plate end 28 and an opposite second plate end 30. A first side wall 32 extends in height away from the first surface 24 along one lateral side of the plate portion and a like second side wall 34 extends in height along the other lateral side of the plate portion. Each side wall has a constant wall height as the side wall initially extends from the first plate end towards the second plate end, and has a reduced wall height extending to the second plate end.

The DIN rail retention latch 20 is attached to the base plate 18 and is located on the second side 26 of the base plate (refer also to FIGS. 5 and 6). The illustrated latch is configured to attach the base plate 18 to a 35 mm top hat DIN rail.

The latch 20 includes a fixed latch member 36 and a relatively movable latch member 38. The movable latch member is attached to the second side of the base plate by channel members 40 on the second side of the base plate. The fixed and movable latch members define between them an adjustable-width channel that receives the flanges of the DIN rail. The latch includes a compression spring 42 captured between a fixed spring stop 44 disposed on the second side of the base plate and a movable spring stop 46 carried on the movable latch member. The compression spring urges the movable latch member towards the fixed latch member and assures the base plate is securely latched to the DIN rail. A latch stop member 47 extends from the second side of the base plate in the path of movement of the latch spring stop 44 to define a closed position of the movable latch member.

Other latch configurations for attaching a member to a DIN rail are known and can be adapted for use as the latch 20. The latch can be configured for attaching the base plate to a larger or smaller top hat DIN rail, or for attaching the base plate 18 to a C section DIN rail, a G section DIN rail, or other mounting rail.

Because the illustrated base 12 attaches to a 35 mm top hat DIN rail, a pair of rail support tabs 49 on opposite lateral sides of the base plate extend downwardly away from the second side 26. The tabs closely receive the DIN rail and assist the DIN rail retention latch 20 in supporting the mounting bracket 10 on the DIN rail.

The fixed latch member 36, the channel members 40, the fixed spring stop 44, the latch stop member 47, and the rail support tabs 49 are each stamped from the integral sheet metal plate forming the base plate 18.

The mounting clip 14 is illustrated in FIGS. 9 and 10. The component housing to be attached to the DIN rail by the mounting bracket 10 is attached to and carried by the mounting clip. The mounting clip includes a first flat plate or wall portion 48 and a second flat plate or wall portion 50, each wall portion being generally rectangular in shape. The first and second wall portions define an "L"-shaped bracket 52 of the mounting clip, with the second wall portion being perpendicular to the first wall portion. The illustrated mounting clip further includes a third flat plate or wall portion 54 that cooperates with the first and second wall portions in defining a "U" shaped bracket 56 of the mounting clip. The third wall portion faces and is parallel with the first wall portion and is perpendicular to the second wall portion. See also FIGS. 5 and 6.

As will be described in greater detail below, the component housing is attached to the bracket defined by the mounting clip. In the illustrated mounting clip a component housing is closely received between the first wall portion 48 and the third wall portion 54 and is supported on the second wall portion 50 of the bracket 56. The mounting clip 14 can be designed so that the uniform width gap between the first wall portion and the third wall portion is sized to closely receive a component housing of a given housing thickness.

To further assist in securing the component housing held in the mounting clip 14, the upper free end portion 58 of the third wall portion 54 includes a rounded bead or contact nose profile 60. The bead profile extends into the uniform width gap between the third wall portion and the first wall portion 48 and defines a narrowed portion of the air gap between the first and third wall portions. When the component housing is closely received between the first and third wall portions, the bead profile is elastically deflected by the component housing away from the first wall portion 48, thereby forming an interference fit of the component housing between the first wall portion and the bead profile that resists displacement of the component housing when carried by the mounting clip.

The fastener assembly 16 in addition to removably attaching the mounting clip 14 to the base 12 enables the angular orientation of the attached mounting clip to selectively vary with respect to the base. As explained in further detail below, the fastener assembly 16 further forms non-rotatable connections between the mounting clip and the base when the mounting clip is attached to the base in predetermined angular orientations with respect to the base.

The fastener system 16 includes a bolt 62 that threadingly engages a nut 64. See FIGS. 5-10. In the illustrated embodiment the bolt is attached to the base 12 and the nut is attached to the mounting clip 14.

The bolt 62 includes an enlarged bolt head 66 and a threaded shank 68. The bolt extends through a hole 70 in the base plate 18 located between the fixed latch member 36 and the latch stop member 47. The bolt head is on the second side 26 of the base plate and the bolt shank extends away from the head, through the hole 70, and the threaded portion of the shank extends outwardly away from the first side 24 of the base to a free end spaced away from the base 12. The shank defines a longitudinal axis 71 that is perpendicular to the base first surface 24. The bolt is rotatably held by the base plate 18 as a captive fastener whereby rotation of the bolt does not generate translation of the bolt along the bolt axis relative to the base. The bolt head is a slotted fillister head that enables torque to be applied to the bolt head by a screwdriver or similar tool. The bolt head is disposed between the fixed latch member 36 and the movable latch member 38 and is accessible to a screwdriver when the movable latch member is in its closed position against the latch stop member 47 and the base 12 is not attached to a DIN rail.

The nut 64 is mounted in a generally frustum-shaped recess 72 formed in the first wall portion 48 of the mounting clip 14. The recess extends away from the third wall portion 54 to a flat, planar recessed wall portion 74. A hole 76 extends through the recessed wall portion. The nut is fixedly attached to the recessed wall portion on the side facing the third wall portion. The nut is aligned with the hole 76 to permit the bolt to extend through the hole 76 and threadingly engage the nut.

Threading the nut 64 on the bolt 62 connects the mounting clip 14 and the base 12. Rotation of the bolt enables the mounting clip to translate along the longitudinal axis of the bolt towards and away from the base. The mounting clip can be manually held in a fixed angular orientation with respect to the base during rotation of the bolt, translating the mounting clip along the bolt while maintaining the fixed angular orientation during translation.

The mounting clip frustum-shaped recess 72 is sized to be received between the first side wall 32 and the second side wall 34 of the base plate 18 as the mounting clip approaches the base regardless of the angular orientation of the mounting clip. Translation of the mounting clip towards the base is limited by the flat recessed wall portion 74 of the mounting clip recess engaging against the flat first surface 24 of the base plate. When the recessed wall portion is engaged against the base plate the non-recessed portion of the mounting clip first wall portion 48 overlays the first side wall 32 and the second side wall 34 of the base plate.

As described above, the fastener assembly 16 can press the mounting clip 14 against the base 12 to fix the mounting clip with respect to the base in any desired angular orientation of the mounting clip with respect to the base. Friction between the nut 64 and the bolt 62 and between the mounting clip recessed wall portion 74 and the base plate first surface 24 resist relative rotation between the mounting clip and base. The threaded connection between the nut and bolt resist translation of the mounting clip away from the base.

The fastener assembly 16 in the illustrated embodiment however also includes structure that defines non-rotatable connections between the mounting clip 14 and the base 12 when the mounting clip is held against the base by the fastener assembly as described above when the mounting clip is oriented in predetermined angular orientations with respect to the base. The illustrated fastener assembly forms non-rotatable connections with the mounting clip located in any one of four angular orientations with respect to the base shown in FIGS. 1-4. The illustrated mounting bracket allows four angular orientations being separated by ninety degrees from one another. Other possible embodiments of the fastener assembly could form non-rotatable connections in fewer than four angular positions or in more than four angular positions, or with angular positions spaced differently than a uniform ninety degrees apart.

The first side wall 32 and the second side wall 34 of the base plate 18 each include like, parallel increased height bosses or tabs 78 that each extend a limited distance along the corresponding side wall. The mounting clip 14 includes a pair of like first through slots 80 disposed opposite from each other and extending laterally on or adjacent opposite sides of the first wall portion 48 and extending inwardly from each respective lateral edge. The mounting clip 14 also includes a pair of like second through slots 82 centered between the lateral edges of the first wall portion 48 and surrounded by a wall surface extending through the thickness of the wall portion. The second slots 82 are disposed opposite each other and are arranged with the first slots 80 define a square, each slot centered along a respective side of the square.

Each slot 80 and slot 82 are sized to closely receive a boss 78 to form non-rotatable connections between the mounting clip 14 and the base 12 when the mounting clip is fastened against the base.

As shown to FIGS. 1-4, the mounting clip can be positioned in one of four different angular positions spaced ninety degrees apart from each other to form non-rotatable connections between the mounting clip and base when the mounting clip is fastened against the base. In the zero degrees position of the mounting clip shown in FIG. 1 and the one hundred eighty degrees position of the mounting clip shown in FIG. 3, the bosses of the base are received in respective first slots 80 of the mounting clip.

Figure 11:
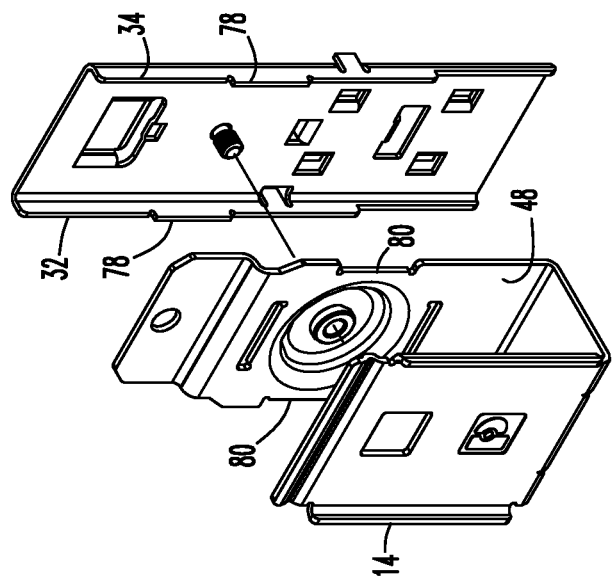
FIG. 11 is an exploded view of the mounting bracket shown in FIG. 1 and as viewed in FIG. 1.

FIG. 11 illustrates the mounting clip 14 in the zero degrees position with respect to the base plate 18 but with the mounting clip spaced away from and disengaged from the base plate. The first slots 80 are axially aligned with and overlaying respective bosses 78. Because the bosses are spaced apart essentially the width of the mounting clip, the first slots 80 are formed as notches extending along and into the sides of the mounting clip first wall portion 48.

Figure 13:
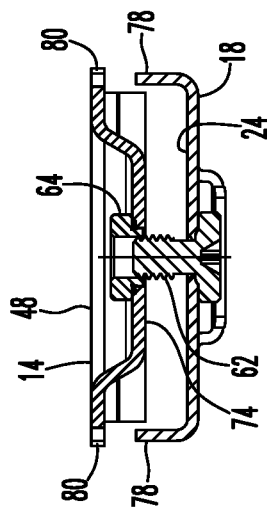
FIG. 13 is a sectional view taken along lines 13-13 of FIG. 12.
Figure 12:
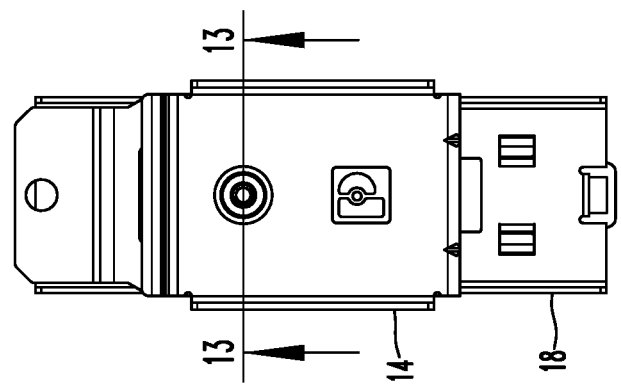
FIG. 12 is a front view of the mounting bracket shown in FIG. 11, the mounting clip in the disengaged position.

FIGS. 12 and 13 illustrates the mounting clip 14 in the zero degrees position relative to the base plate 18 as in FIG. 11 but with the bolt 62 beginning to be threaded into the nut 64. The mounting clip 14 is spaced from the base plate 18 and can be placed in any desired angular orientation with respect to the base plate.

Turning the bolt 62 while maintaining the relative angular orientation of the mounting clip 14 and the base 12 causes the mounting clip to translate along the bolt axis 71 towards the base plate, and to engage against the base plate.

Figure 14:
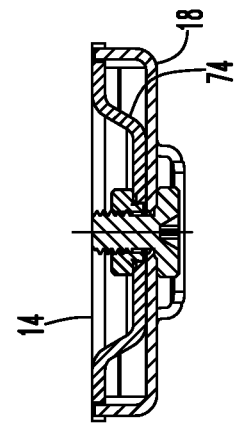
FIG. 14 is a sectional view similar to FIG. 13 but with the mounting clip in the engaged position.

FIG. 14 illustrates the mounting clip 14 engaged against the base plate 18. The flat recessed wall 74 is against the flat first surface 24 of the base plate. The bosses 78 are closely received within the respective notches 80. The mounting clip surfaces facing the notches cooperate with the bosses to form a non-rotatable connection between the mounting clip and the base. The depth of the mounting clip recessed wall portion 74 enables the bolt 62 to extend past the nut 64 but without extending into the uniform width gap that receives the component housing.

When the mounting clip 14 is positioned in the one hundred eighty degrees position relative to the base 12, the first slots 80 are axially aligned with and overlaying respective opposite bosses 78 to form non-rotatable connections between the mounting clip and the base when the mounting clip is engaged the base.

In the ninety degrees position of the mounting clip 14 shown in FIG. 2 and the two hundred seventy degrees position of the mounting clip shown in FIG. 4, the second slots 82 of the mounting clip are first axially aligned with and overlaying the respective bosses 78, and the bosses 78 are closely received in the second slots when the mounting clip threaded onto the bolt and is engaged against the base. Because the lateral length of the mounting clip first wall portion 48 is longer than the width between the bosses, the second slots 82 are each totally surrounded by an annular wall of the mounting clip. The mounting clip surfaces bounding the second slots cooperate with the bosses to form the non-rotatable connection between the mounting clip and the base.

The mounting clip 14 is fastened to the base 12 in the desired angular orientation before the mounting bracket 10 is attached to the DIN rail. This enables access to the bolt head for tightening the mounting clip against the base. The mounting clip can be repositioned with respect to the base by removing the mounting bracket from the DIN rail to again provide access to the bolt head.

Figure 18:
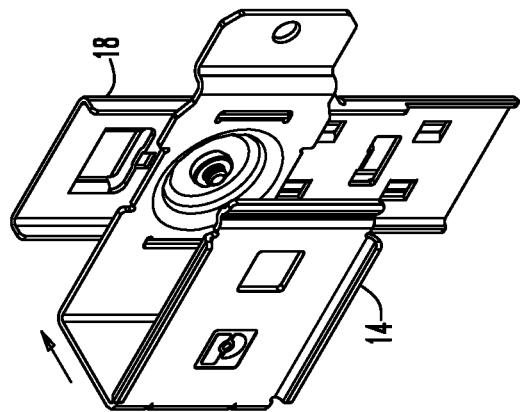
FIGS. 15-18 sequentially illustrate changing the position of the mounting clip of the mounting bracket shown in FIG. 1 from the zero degrees position shown in FIG. 15 to the two hundred seventy degrees position shown in FIG. 18.
Figure 17:
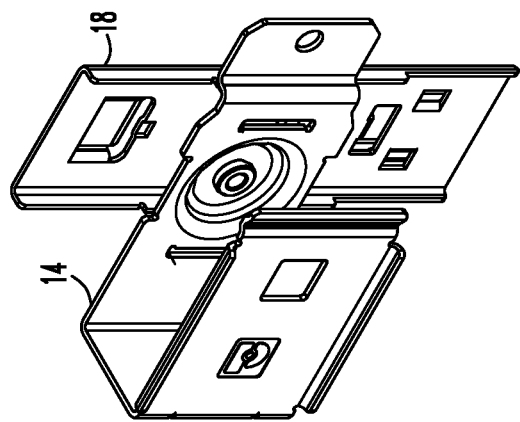
Figure 16:
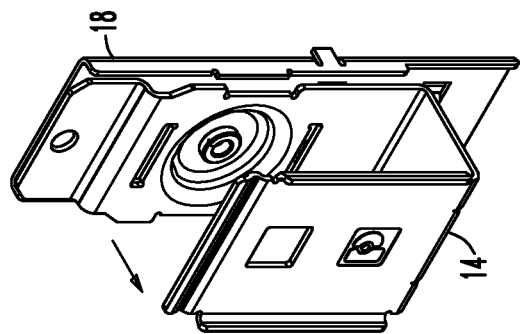
Figure 15:
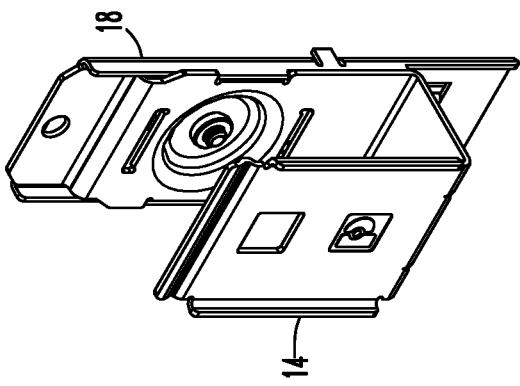

FIGS. 15-18 illustrate the steps in reorienting the mounting clip 14 from the zero degrees position shown in FIG. 1 to the two hundred seventy degrees position shown in FIG. 3. The bolt is turned in the loosening direction to translate the mounting clip away from the base plate 18 as shown by the arrow in FIG. 16, removing the non-rotatable connection between the mounting clip and the base. The mounting clip can now rotate about the bolt axis. The mounting clip is rotated from the zero degrees position shown in FIG. 16 to the two hundred seventy degrees position as shown in FIG. 17. The bolt is then turned in the tightening direction to translate the mounting clip towards the base plate as shown by the arrow in FIG. 18. The mounting clip and base plate form another non-rotatable connection with the mounting clip oriented with respect to the base plate as shown in FIG. 18.

Figure 19:
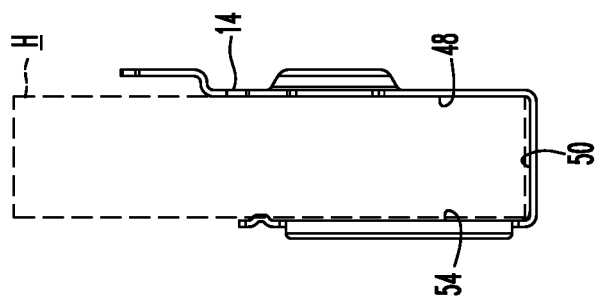
FIG. 19 is similar to FIG. 9 but illustrate the mounting clip holding a component housing.

FIG. 19 illustrates the mounting clip 14 carrying a component housing H (the component housing is shown in dashed lines in the figure). The component housing is closely received in the gap between the first wall portion 48 and the third wall portion 54.

The illustrated mounting clip 14 is intended to carry a component housing H having a DIN rail retention latch capable of attaching the component housing to a 35 mm top hat DIN rail (to simplify the component housing latch is not shown in the drawing). The second wall portion 50 of the mounting clip is flat and has a width between its lateral edges equal to the width across the flanges of the DIN rail. The second wall portion can be received by the component housing latch to attach the component housing to the mounting clip.

Other embodiments of the mounting clip 14 can include holes, slots, or other attachment structures or fasteners to attach a component housing to the mounting clip 14 instead of or as an alternative to attachment by a DIN rail retention latch.

The component housing H presses against the contact nose profile 60, elastically deflecting the third wall portion 54 and enabling the contact nose profile to apply a spring force urging the component housing towards the first wall portion 48.

Figure 21:
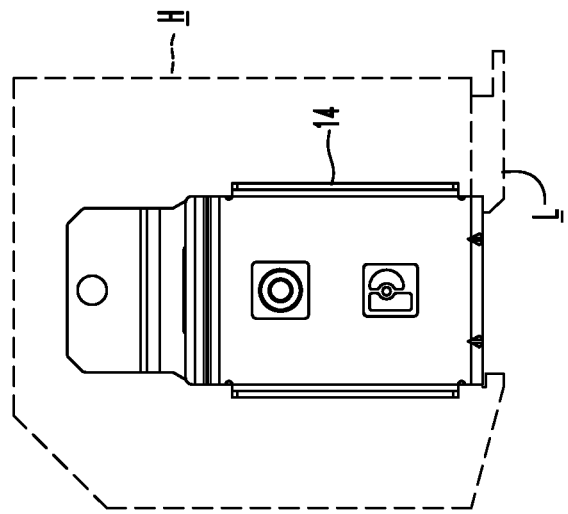
FIG. 21 is similar to FIG. 20 but with the component housing reversed one hundred eighty degrees.
Figure 20:
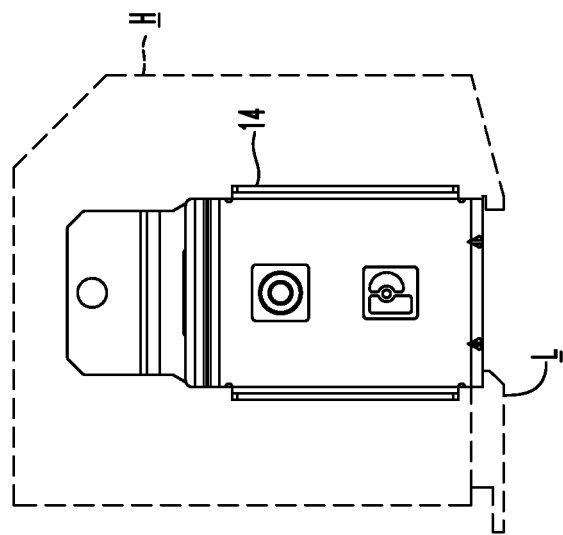
FIG. 20 is a front view of the mounting clip shown in FIG. 19.
Figure 22:
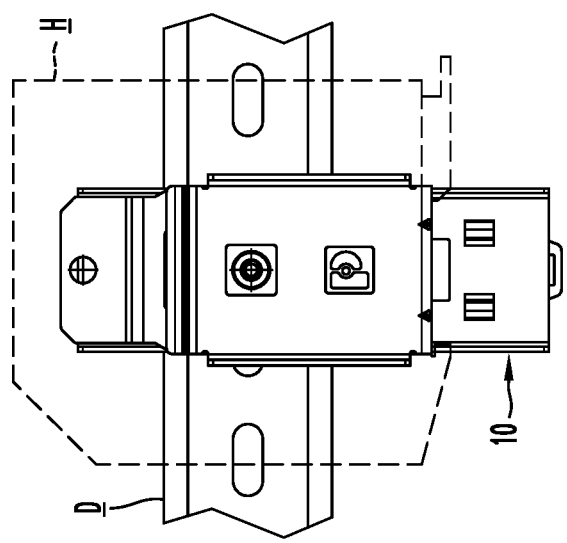
FIG. 22 is similar to FIG. 21 but with the mounting bracket attached to a DIN rail with the mounting clip in the zero degrees position.

FIGS. 20 and 21 illustrate the component housing H mounted to the mounting clip second wall portion 50 by a DIN retention latch L. The latch L is similar to the mounting bracket latch 20. FIG. 20 illustrates the component housing attached to the mounting clip 14 with its fixed latch member on the left side of the mounting clip as viewed in the figure. FIG. 22 illustrates the component housing attached to the mounting clip but with the fixed latch member on the right side of the mounting clip as viewed in the figure. That is, the component housing can be attached to the mounting clip in one of two orientations one hundred eighty degrees apart, for additional flexibility in mounting the component housing in a desired orientation within an equipment cabinet.

Figure 23:
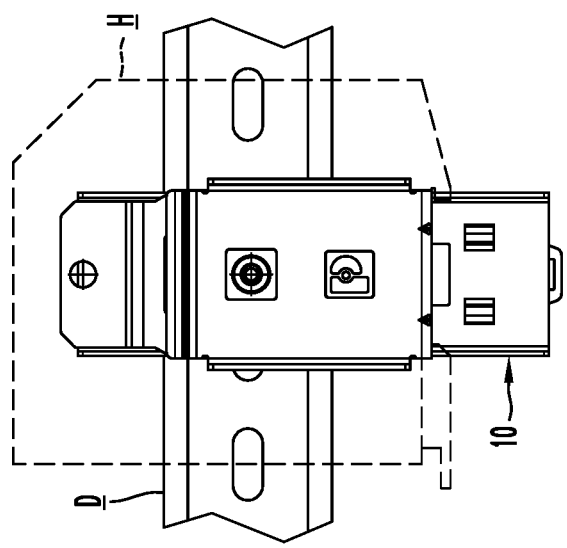
FIG. 23 is similar to FIG. 20 but with the mounting bracket attached to a DIN rail with the mounting clip in the zero degrees position.

FIGS. 22 and 23 illustrate this flexibility with respect to a 35 mm top hat DIN rail D. Each figure illustrates the mounting clip forming a part of a mounting bracket 10 attached to a DIN rail D and carrying the component housing H. The mounting bracket is oriented in the zero degrees position as shown in FIG. 1. FIGS. 22 and 23 illustrate the component housing attached to the mounting clip in the orientations shown in FIGS. 21 and 20 respectively.

Figure 24:
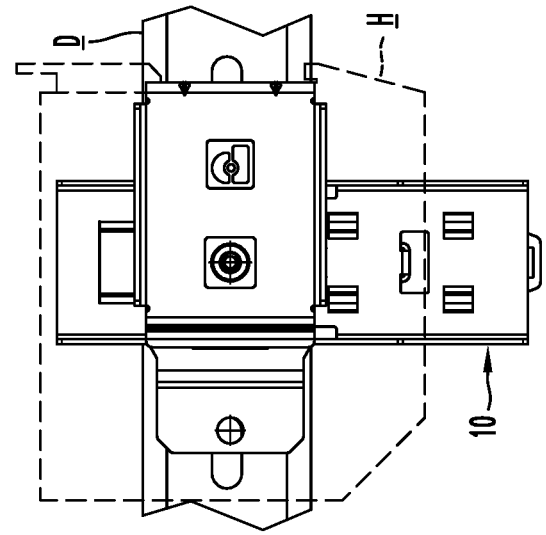
FIG. 24 is similar to FIG. 22 but with the mounting clip in the ninety degrees position.

As can be seen in FIGS. 22 and 23, the component housing H extends in a height direction away from the latch L in a plane that is parallel with the planes defined by the DIN rail flanges (that are parallel with the plane of the drawing sheet). As can be seen in FIGS. 23 and 24, the mounting bracket angular position of the component housing H can be selected to orient the length dimension of the component housing in different angular orientations with respect to the longitudinal axis of the DIN rail. Thus a component housing could be oriented in the equipment cabinet as shown in FIG. 24 regardless of whether the DIN rail D is horizontal as shown in FIG. 24 or is vertical.

Figure 25:
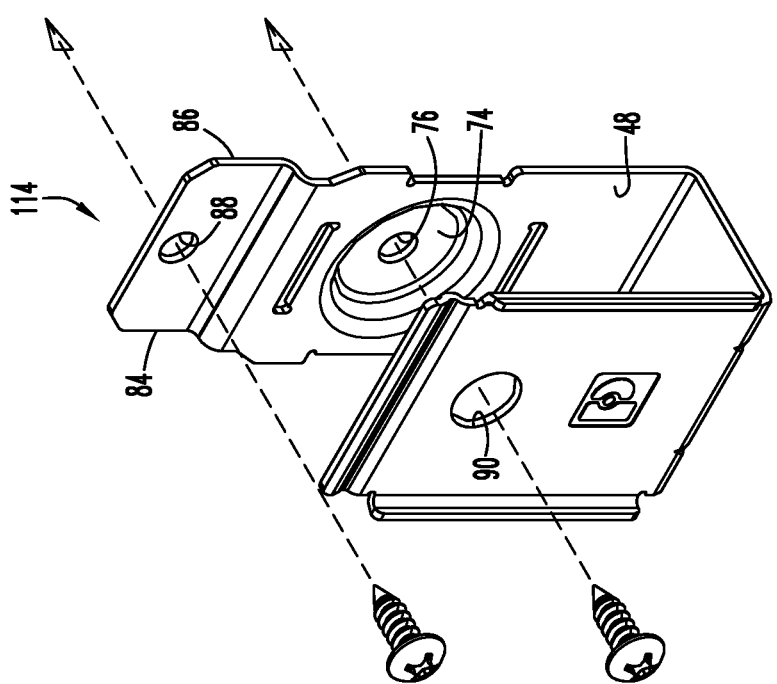
FIG. 25 is a perspective view of a second embodiment mounting clip capable of being directly attached by screws to a flat panel.

The illustrated mounting clip 14 and a similar second embodiment mounting clip 114 shown in FIG. 25 each have like additional mounting structure that enables use of the mounting clip independently of the base 12 and without use of the nut 64. The same reference numbers will be used to refer to corresponding components of the first mounting clip 14 and the second mounting clip 114. Each of the first mounting clip 14 and the second mounting clip 114 includes an additional attachment portion 84 disposed at the free portion of the first wall portion 48 (best seen in FIG. 9). The additional attachment portion includes a second flat planar wall portion 86 that is spaced from and co-planar with the flat recessed wall portion 74. A through hole 88 extends through the flat wall portion 86. The third wall portion of the mounting clip includes an enlarged through hole 90 coaxial with the mounting clip through hole 76 of the fastener assembly. The enlarged through hole 90 of the first embodiment mounting clip 14 is a square hole (see FIG. 5). The enlarged through hole 90 of the second embodiment mounting clip 114 is a circular through hole (the only difference between the first mounting clip 14 and the second mounting clip 114).

To use the mounting clip 14 or mounting clip 114 alone, the mounting clip flat wall portion 74 and the second flat wall portion are placed against a flat panel or similar mounting structure. Screws can be driven through the fastener hole 76 and the attachment through hole 88 to mount the mounting clip to the panel as shown in FIG. 25.

Mounting clips having different overall widths or second wall portion configurations/widths to accommodate carrying component housings having DIN rail retention latches for attaching the component to wider, narrower, or different DIN rail geometries than a 35 mm top hat DIN rail can be designed for use with the same base 12 and would enable attaching such a component housing to a 35 mm top hat DIN rail. The first slots 80 formed in wider mounting clips may each be totally surrounded by an annular wall of the mounting clip. Narrower mounting clips may retain the same width of the first wall portion 48 for use with the mounting clip 14 but may have a narrower second wall portion 50 to accommodate the component housing latch.

If a mounting clip does not include an additional attachment portion 84, one of the second slots 82 may be formed as a notch located along an upper edge of the mounting first wall portion 48. The design of other embodiments may design a mounting clip differently for use with a given base (for example, a mounting clip with a narrower width might form non-rotatable connections with the base in only the ninety degrees and two hundred seventy degrees orientations if the mounting clip is narrower than the distance between the bosses.

Other structures to form non-rotatable connections between the mounting clip and the base of the mounting bracket are possible. For example, the base plate could have tabs that extend away from the first surface of the base plate and are received in corresponding slots or indentations formed in the recessed wall portion of the mounting clip.

While this disclosure includes one or more illustrative embodiments described in detail, it is understood that the one or more embodiments are each capable of modification and that the scope of this disclosure is not limited to the precise details set forth herein but include such modifications that would be obvious to a person of ordinary skill in the relevant art including (but not limited to) changes in material selection, size, operating ranges, the number and location of angular positions of the mounting clip with respect to the base that form non-rotatable connections therebetween, environment of use, component housing mounting structure, and the like, fasteners, as well as such changes and alterations that fall within the purview of the following claims.

What is claimed is:

1. A mounting bracket for attaching a component housing to a mounting rail, the mounting bracket comprising:
    a mounting clip and a base, the mounting clip comprising an attachment portion that attaches the component housing to the mounting clip;
    the base comprising a first side, an opposite second side, and a latch on the second side, the latch being capable of attaching the base to the mounting rail;
    the mounting clip being rotatably attached to the base on the first side of the base, the mounting clip being rotatable about an axis and axially movable with respect to the base parallel with the axis towards and away from the first side of the base, the mounting clip axially movable between a disengaged position spaced from the base and an engaged position adjacent to the base;
    the mounting clip when in the disengaged position being rotatable about the axis to selectively orient the mounting clip in a selected angular position with respect to the base, the mounting clip when in the disengaged position being axially movable to the engaged position while maintaining the mounting clip in the selected angular position;
    when the mounting clip is in the engaged position, the mounting clip and the base cooperatively resist rotation of the mounting clip to maintain the mounting clip in the selected angular position; and
    the mounting clip comprising an "L" shaped bracket, the bracket comprising a first wall facing the base and a second wall extending transversely from the first wall, the second wall comprising the attachment portion of the mounting clip.

2. The mounting bracket of claim 1 wherein the mounting clip comprises a third wall spaced from and facing the first wall, the second wall connecting the first wall and the third wall, the walls cooperatively defining a "U" shaped bracket of the mounting clip.

3. The mounting bracket of claim 2 wherein the first and third wall of the mounting clip define a gap therebetween, and the third wall comprises a contact nose profile extending into the gap and narrowing the gap at the contact nose profile.

4. A mounting bracket for attaching a component housing to a mounting rail, the mounting bracket comprising:
    a mounting clip and a base, the mounting clip comprising an attachment portion that attaches the component housing to the mounting clip;
    the base comprising a first side, an opposite second side, and a latch on the second side, the latch being capable of attaching the base to the mounting rail;
    the mounting clip being rotatably attached to the base on the first side of the base, the mounting clip being rotatable about an axis and axially movable with respect to the base parallel with the axis towards and away from the first side of the base, the mounting clip axially movable between a disengaged position spaced from the base and an engaged position adjacent to the base;
    the mounting clip when in the disengaged position being rotatable about the axis to selectively orient the mounting clip in a selected angular position with respect to the base, the mounting clip when in the disengaged position being axially movable to the engaged position while maintaining the mounting clip in the selected angular position,
    when the mounting clip is in the engaged position, the mounting clip and the base cooperatively resist rotation of the mounting clip to maintain the mounting clip in the selected angular position;
    a fastener assembly attaching the mounting clip to the base, the fastener assembly comprising a bolt attached to one of the mounting clip and the base, the bolt defining the axis, and a nut attached to the other of the mounting clip and the base, the nut threadable along the bolt;
    the bolt being a captive fastener held by the one of the mounting clip and the base whereby rotation of the bolt about the axis does not generate a translation of the bolt along the axis;
    the bolt being attached to the base and the nut being attached to the mounting clip, the bolt comprising an enlarged head on an end of the bolt and a threaded shank on an opposite end of the bolt, the bolt head on the second side of the base, and the shank extending away from the first side of the base to the opposite end of the bolt; and
    the mounting clip comprising an "L" shaped bracket comprising a first wall facing the base and a second wall comprising the attachment portion, the first wall comprising a recessed portion that extends towards the base, the nut disposed in the recessed portion.

5. A mounting bracket for attaching a component housing to a mounting rail, the mounting bracket comprising:
    a mounting clip and a base, the mounting clip comprising an attachment portion that attaches the component housing to the mounting clip;

the base comprising a first side, an opposite second side, and a latch on the second side, the latch being capable of attaching the base to the mounting rail;

the mounting clip being rotatably attached to the base on the first side of the base, the mounting clip being rotatable about an axis and axially movable with respect to the base parallel with the axis towards and away from the first side of the base, the mounting clip axially movable between a disengaged position spaced from the base and an engaged position adjacent to the base;

the mounting clip when in the disengaged position being rotatable about the axis to selectively orient the mounting clip in a selected angular position with respect to the base, the mounting clip when in the disengaged position being axially movable to the engaged position while maintaining the mounting clip in the selected angular position;

when the mounting clip is in the engaged position, the mounting clip and the base cooperatively resist rotation of the mounting clip to maintain the mounting clip in the selected angular position;

a fastener assembly attaching the mounting clip to the base, the fastener assembly comprising a bolt attached to one of the mounting clip and the base, the bolt defining the axis, and a nut attached to the other of the mounting clip and the base, the nut threadable along the bolt;

the bolt being a captive fastener held by the one of the mounting clip and the base whereby rotation of the bolt about the axis does not generate a translation of the bolt along the axis;

the bolt being attached to the base and the nut being attached to the mounting clip, the bolt comprising an enlarged head on an end of the bolt and a threaded shank on an opposite end of the bolt, the bolt head on the second side of the base, and the shank extending away from the first side of the base to the opposite end of the bolt; and the latch being in an unlatched state when the mounting bracket is not attached to a mounting rail, and the bolt head being accessible to a tool configured to apply torque to the bolt head when the latch is in the unlatched state.

6. A mounting bracket for attaching a component housing to a mounting rail, the mounting bracket comprising:

a mounting clip and a base, the mounting clip comprising an attachment portion that attaches the component housing to the mounting clip;

the base comprising a first side, an opposite second side, and a latch on the second side, the latch being capable of attaching the base to the mounting rail;

the mounting clip being rotatably attached to the base on the first side of the base, the mounting clip being rotatable about an axis and axially movable with respect to the base parallel with the axis towards and away from the first side of the base, the mounting clip axially movable between a disengaged position spaced from the base and an engaged position adjacent to the base;

the mounting clip when in the disengaged position being rotatable about the axis to selectively orient the mounting clip in a selected angular position with respect to the base, the mounting clip when in the disengaged position being axially movable to the engaged position while maintaining the mounting clip in the selected angular position;

when the mounting clip is in the engaged position, the mounting clip and the base cooperatively resist rotation of the mounting clip to maintain the mounting clip in the selected angular position;

the base and the mounting clip cooperatively forming a non-rotatable connection between them when the mounting clip is in the engaged position, and one of the mounting clip and the base comprising a slot and the other of the mounting clip and the base comprising a tab, the tab received within the slot to form the nonrotatable connection when the mounting clip is in the engaged position.

7. A mounting bracket for attaching a component housing to a mounting rail, the mounting bracket comprising:

a mounting clip and a base, the mounting clip comprising an attachment portion that attaches the component housing to the mounting clip;

the base comprising a first side, an opposite second side, and a latch on the second side, the latch being capable of attaching the base to the mounting rail;

the mounting clip being rotatably attached to the base on the first side of the base, the mounting clip being rotatable about an axis and axially movable with respect to the base parallel with the axis towards and away from the first side of the base, the mounting clip axially movable between a disengaged position spaced from the base and an engaged position adjacent to the base;

the mounting clip when in the disengaged position being rotatable about the axis to selectively orient the mounting clip in a selected angular position with respect to the base, the mounting clip when in the disengaged position being axially movable to the engaged position while maintaining the mounting clip in the selected angular position, and when the mounting clip is in the engaged position, the mounting clip and the base cooperatively resist rotation of the mounting clip to maintain the mounting clip in the selected angular position; and the latch being operable to latch the base onto a standard DIN rail, and the attachment portion being disposed to be received in and held by a DIN rail retention latch of the component housing.

8. A mounting bracket for attaching a component housing to a mounting rail, the mounting bracket comprising:

a mounting clip and a base, the mounting clip comprising an attachment portion that attaches the component housing to the mounting clip;

the base comprising a first side, an opposite second side, and a latch on the second side, the latch being capable of attaching the base to the mounting rail;

the mounting clip on the first side of the base and being axially movable with respect to the base along an axis towards and away from the first side of the base, the mounting clip being axially movable between a disengaged position spaced from the first side of the base and an engaged position closer to the first side of the base;

the mounting clip when in the disengaged position selectively positionable about the axis to two or more selectable angular positions with respect to the base, the selectable angular positions being angularly spaced apart from one another;

the mounting clip when in the disengaged position and with the mounting clip in any one of the selectable angular positions movable to the engaged position while maintaining the mounting clip in the one selectable angular position;

the mounting clip when in the engaged position while in any one of the selectable angular positions cooperating with the base in forming a nonrotatable connection between the mounting clip and the base that resists rotation of the mounting clip about the axis; and one of the mounting clip and the base comprising a tab that extends axially, the tab engaging the other of the mounting clip and the base and thereby cooperatively forming the nonrotatable connection between the mounting clip and the base.

9. The mounting bracket of claim 8 wherein the other of the mounting clip and the base comprises a slot, the tab received in the slot and thereby cooperatively forming with the slot the nonrotatable connection between the mounting clip and the base.

10. The mounting bracket of claim 9 wherein the other of the mounting clip and the base comprises one or more additional slots, each slot of the other of the mounting clip and the base being associated with a respective selectable angular position of the mounting clip, the tab being received within a respective one of the slots when the mounting clip and the base are cooperatively forming a nonrotatable connection.

11. The mounting bracket of claim 10 wherein the one of the mounting clip and the base comprises at least one additional tab, at least two tabs of the one of the mounting clip and the base being received in respective slots of the other of the mounting clip and the base when the mounting clip and the base are cooperatively forming a nonrotatable connection.

12. The mounting bracket of claim 11 wherein the mounting clip comprises the slots and the base comprises the tabs, the mounting clip having four slots, the base comprising two tabs, the slots being angularly spaced ninety degrees apart from one another about the axis, the tabs being angularly spaced one hundred eighty degrees apart from one another around the axis.

13. A mounting bracket for attaching a component housing to a mounting rail, the mounting bracket comprising:

a mounting clip and a base, the mounting clip comprising an attachment portion that attaches the component housing to the mounting clip;

the base comprising a first side, an opposite second side, and a latch on the second side, the latch being capable of attaching the base to the mounting rail;

the mounting clip on the first side of the base and being axially movable with respect to the base along an axis towards and away from the first side of the base, the mounting clip being axially movable between a disengaged position spaced from the first side of the base and an engaged position closer to the first side of the base;

the mounting clip when in the disengaged position selectively positionable about the axis to two or more selectable angular positions with respect to the base, the selectable angular positions being angularly spaced apart from one another;

the mounting clip when in the disengaged position and with the mounting clip in any one of the selectable angular positions movable to the engaged position while maintaining the mounting clip in the one selectable angular position;

the mounting clip when in the engaged position while in any one of the selectable angular positions cooperating with the base in forming a nonrotatable connection between the mounting clip and the base that resists rotation of the mounting clip about the axis;

a bolt captively held by the base and a nut fixedly attached to the mounting clip, the nut threadable onto the bolt, rotation of the nut when threaded onto the bolt capable of generating axial movement of the mounting clip between disengaged and engaged positions; and the mounting clip comprising an "L" shaped bracket comprising a first wall facing the base and a second wall comprising the attachment portion, the first wall comprising a recessed portion that extends towards the base, the nut disposed in the recessed portion.

14. The mounting bracket of claim 13 wherein the bolt does not extend out of the recessed portion of the mounting clip when the mounting clip is in the engaged position.

* * * * *